United States Patent
Kawasaki

(10) Patent No.: US 10,424,467 B2
(45) Date of Patent: Sep. 24, 2019

(54) SMART RF PULSING TUNING USING VARIABLE FREQUENCY GENERATORS

(71) Applicant: APPLIED MATERIALS, INC., Santa Clara, CA (US)

(72) Inventor: Katsumasa Kawasaki, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/457,798

(22) Filed: Mar. 13, 2017

(65) Prior Publication Data

US 2018/0261430 A1  Sep. 13, 2018

(51) Int. Cl.
*H01J 37/32* (2006.01)
*H01L 21/67* (2006.01)

(52) U.S. Cl.
CPC .... *H01J 37/3299* (2013.01); *H01J 37/32091* (2013.01); *H01J 37/32128* (2013.01); *H01J 37/32146* (2013.01); *H01J 37/32183* (2013.01); *H01J 37/32935* (2013.01); *H01L 21/67069* (2013.01); *H01L 21/67253* (2013.01)

(58) Field of Classification Search
None
See application file for complete search history.

(56) References Cited

U.S. PATENT DOCUMENTS

| | | | |
|---|---|---|---|
| 7,967,944 B2 | 6/2011 | Shannon et al. | |
| 8,002,945 B2 | 8/2011 | Shannon et al. | |
| 8,018,164 B2 | 9/2011 | Shannon et al. | |
| 8,264,154 B2 | 9/2012 | Banna et al. | |
| 8,324,525 B2 | 12/2012 | Shannon et al. | |
| 8,337,661 B2 | 12/2012 | Shannon et al. | |
| 8,357,264 B2 | 1/2013 | Shannon et al. | |
| 8,404,598 B2 | 3/2013 | Liao et al. | |
| 8,962,488 B2 | 2/2015 | Liao et al. | |
| 9,390,893 B2* | 7/2016 | Valcore, Jr. | H01J 37/32183 |
| 9,614,524 B1* | 4/2017 | Kawasaki | H03K 19/0005 |
| 9,754,768 B2 | 9/2017 | Yamada et al. | |
| 2009/0295295 A1 | 12/2009 | Shannon et al. | |

(Continued)

OTHER PUBLICATIONS

U.S. Appl. No. 14/882,878, filed Oct. 14, 2015, Kawasaki et al.

(Continued)

*Primary Examiner* — Angel Roman
(74) *Attorney, Agent, or Firm* — Moser Taboada; Alan Taboada

(57) ABSTRACT

Methods and systems for RF pulse reflection reduction are provided herein. In some embodiments, a method includes (a) receiving a process recipe for processing the substrate that includes a plurality of pulsed RF power waveforms from a plurality of RF generators during a first duty cycle, (b) dividing the first duty cycle into a plurality of equal time intervals, (c) for each RF generator, determining a frequency command set for all intervals and send the frequency command set to the RF generator, wherein the frequency command set includes a frequency set point for each of the intervals in the plurality of equal time intervals, and (d) providing a plurality of RF power waveforms from a plurality of RF generators to a process chamber during a first duty cycle according to the frequency command set sent to each RF generator.

14 Claims, 7 Drawing Sheets

(56) References Cited

U.S. PATENT DOCUMENTS

| | | |
|---|---|---|
| 2013/0260567 A1 | 10/2013 | Marakhtanov et al. |
| 2014/0106572 A1 | 4/2014 | Xu et al. |
| 2014/0213062 A1* | 7/2014 | Shimizu .............. H01L 21/0332 |
| | | 438/719 |
| 2014/0361690 A1 | 12/2014 | Yamada et al. |
| 2016/0276137 A1* | 9/2016 | Valcore, Jr. ....... H01J 37/32183 |
| 2017/0103873 A1* | 4/2017 | Kawasaki ......... H01J 37/32155 |
| 2018/0261430 A1* | 9/2018 | Kawasaki ........... H01J 37/3299 |

OTHER PUBLICATIONS

U.S. Appl. No. 14/886,891, filed Oct. 19, 2015, Kawasaki et al.
U.S. Appl. No. 15/212,879, filed Jul. 18, 2016, Kawasaki.
International Search Report and Written Opinion dated May 28, 2018 for PCT Application No. PCT/US2018/017980.

* cited by examiner

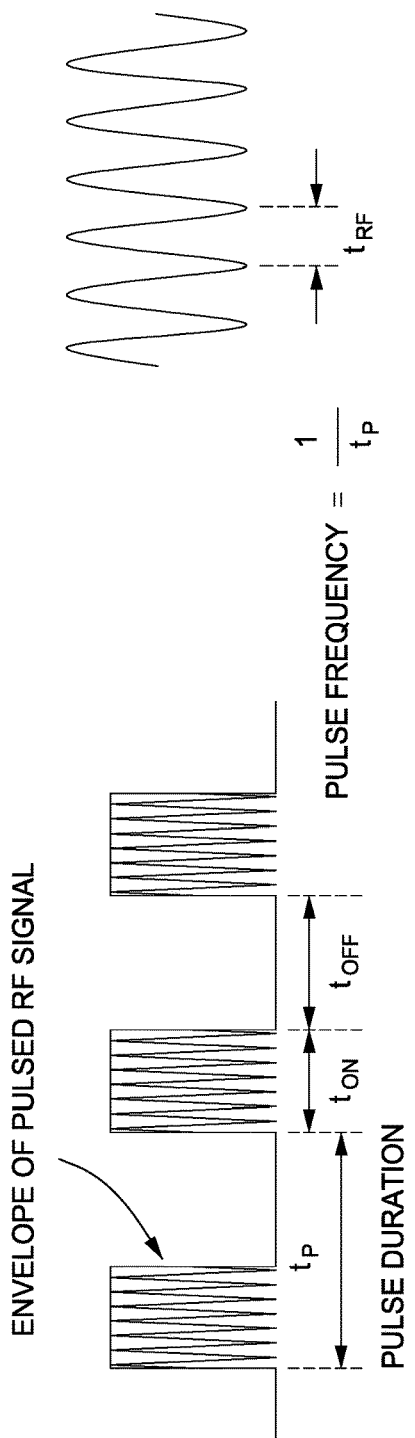
FIG. 2A
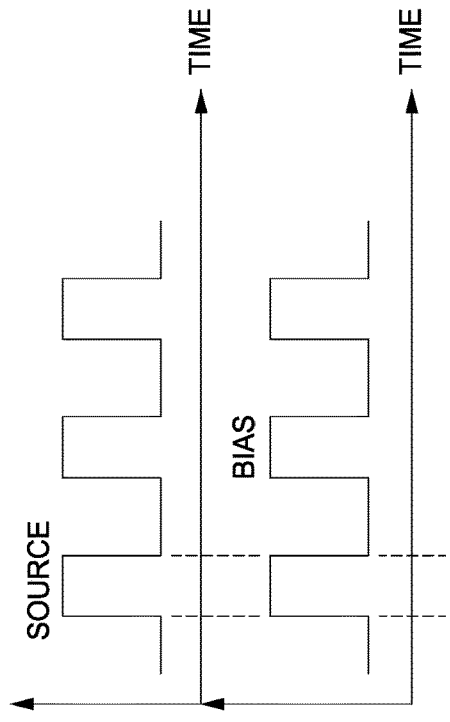
FIG. 2B
FIG. 2C

US 10,424,467 B2

SMART RF PULSING TUNING USING VARIABLE FREQUENCY GENERATORS

FIELD

Embodiments of the present disclosure generally relate to RF power delivery methods used for processing a substrate.

BACKGROUND

In conventional radio frequency (RF) plasma processing, such as that used during stages of fabrication of many semiconductor devices, RF energy may be provided to a substrate process chamber via an RF energy source. The RF energy may be generated and provided in continuous or pulsed wave modes. Due to mismatches between the impedance of the RF energy source and the plasma formed in the process chamber, RF energy is reflected back to the RF energy source, resulting in inefficient use of the RF energy and wasting energy, potential damage to the process chamber or RF energy source, and potential inconsistency/non-repeatability issues with respect to substrate processing. As such, the RF energy is often coupled to the plasma in the process chamber through a fixed or tunable matching network that operates to minimize the reflected RF energy by more closely matching the impedance of the plasma to the impedance of the RF energy source. The matching network ensures that the output of the RF source is efficiently coupled to the plasma to maximize the amount of energy coupled to the plasma (e.g., referred to as tuning the RF power delivery). Thus, the matching network ensures that the total impedance (i.e., plasma impedance+chamber impedance+matching network impedance) is the same as the output impedance of the RF power delivery. In some embodiments, the RF energy source may also be capable of frequency tuning, or adjusting the frequency of the RF energy provided by the RF energy source, in order to assist in impedance matching.

In process chambers that use multiple separate RF power signals pulsed at multiple power levels, synchronized RF pulsing is typically used. The multiple separate RF power signals may be pulsed independently out-of-phase with each other, or with varying duty cycle. Synchronization may be accomplished through the use of transistor-transistor logic (TTL) signals. One master generator creates the TTL signal to the other slave generators for synchronization. Each RF generator (masters and slaves) can provide pulsed RF power at independent duty cycles and/or pulse delays.

However, in RF single level pulsing (SLP) or dual level (DLP) or multi-level pulsing (MLP) using multiple separate RF power signals pulsed at multiple power levels (e.g., each with multiple power settings), the multiple impedance changes that occur during a pulse duty cycle makes impedance tuning difficult. That is, the match network and/or RF generators cannot adequately tune for the reflected power as the reflected power changes multiple times within each duty cycle. More specifically, regular matching networks with variable capacitors or inductors & fixed frequency generators can typically perform impedance matching only for one specific impedance (e.g., an average impedance) because motor speed which drives variable capacitors/inductors, is too slow to follow impedance change in a one pulse cycle (also referred to as a single or first duty cycle herein).

Accordingly, the inventors have provided improved methods and apparatus for RF pulsing tuning using one or more variable frequency generators in addition to using a variable capacitor/inductor to advantageously minimize RF pulse reflection in process chambers that use multiple separate RF power signals, pulsed at multiple power levels during a single duty cycle.

SUMMARY

Methods and systems for RF pulse reflection reduction are provided herein. In some embodiments, a method includes (a) receiving a process recipe for processing the substrate that includes a plurality of pulsed RF power waveforms from a plurality of RF generators during a first duty cycle, (b) dividing the first duty cycle into a plurality of equal time intervals, (c) for each RF generator, determining a frequency command set for all intervals and send the frequency command set to the RF generator, wherein the frequency command set includes a frequency set point for each of the intervals in the plurality of equal time intervals, and (d) providing a plurality of RF power waveforms from a plurality of RF generators to a process chamber during a first duty cycle according to the frequency command set sent to each RF generator.

In some embodiments, a non-transitory computer readable medium having instructions stored thereon that, when executed, cause a method of operating a plasma enhanced substrate processing system using multi-level pulsed RF power to be performed. The method performed may include (a) receiving a process recipe for processing the substrate that includes a plurality of pulsed RF power waveforms from a plurality of RF generators during a first duty cycle, (b) dividing the first duty cycle into a plurality of equal time intervals, (c) for each RF generator, determining a frequency command set for all intervals and send the frequency command set to the RF generator, wherein the frequency command set includes a frequency set point for each of the intervals in the plurality of equal time intervals, and (d) providing a plurality of RF power waveforms from a plurality of RF generators to a process chamber during a first duty cycle according to the frequency command set sent to each RF generator.

In some embodiments, a substrate processing system may include a plurality of RF generators configured to provide a plurality of RF power waveforms to a process chamber during a first duty cycle, a pulse controller coupled to the plurality of RF generators, at least one match network coupled to each of the plurality of RF generators, the process chamber, and the pulse controller, wherein the at least one match network includes at least one measuring device configured to measure reflected power for the plurality of RF power waveforms and at least one variable match component. In some embodiments, the at least one match network is configured to (a) receive a process recipe for processing the substrate that includes a plurality of pulsed RF power waveforms from a plurality of RF generators during a first duty cycle, (b) divide the first duty cycle into a plurality of equal time intervals, (c) for each RF generator, determine a frequency command set for all intervals, and (d) send the frequency command set to the RF generator, wherein the frequency command set includes a frequency set point for each of the intervals in the plurality of equal time intervals.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

FIG. 2A-C depicts pulsed waveforms of radio frequency signals in accordance with some embodiments of the present disclosure.

Figure 1:
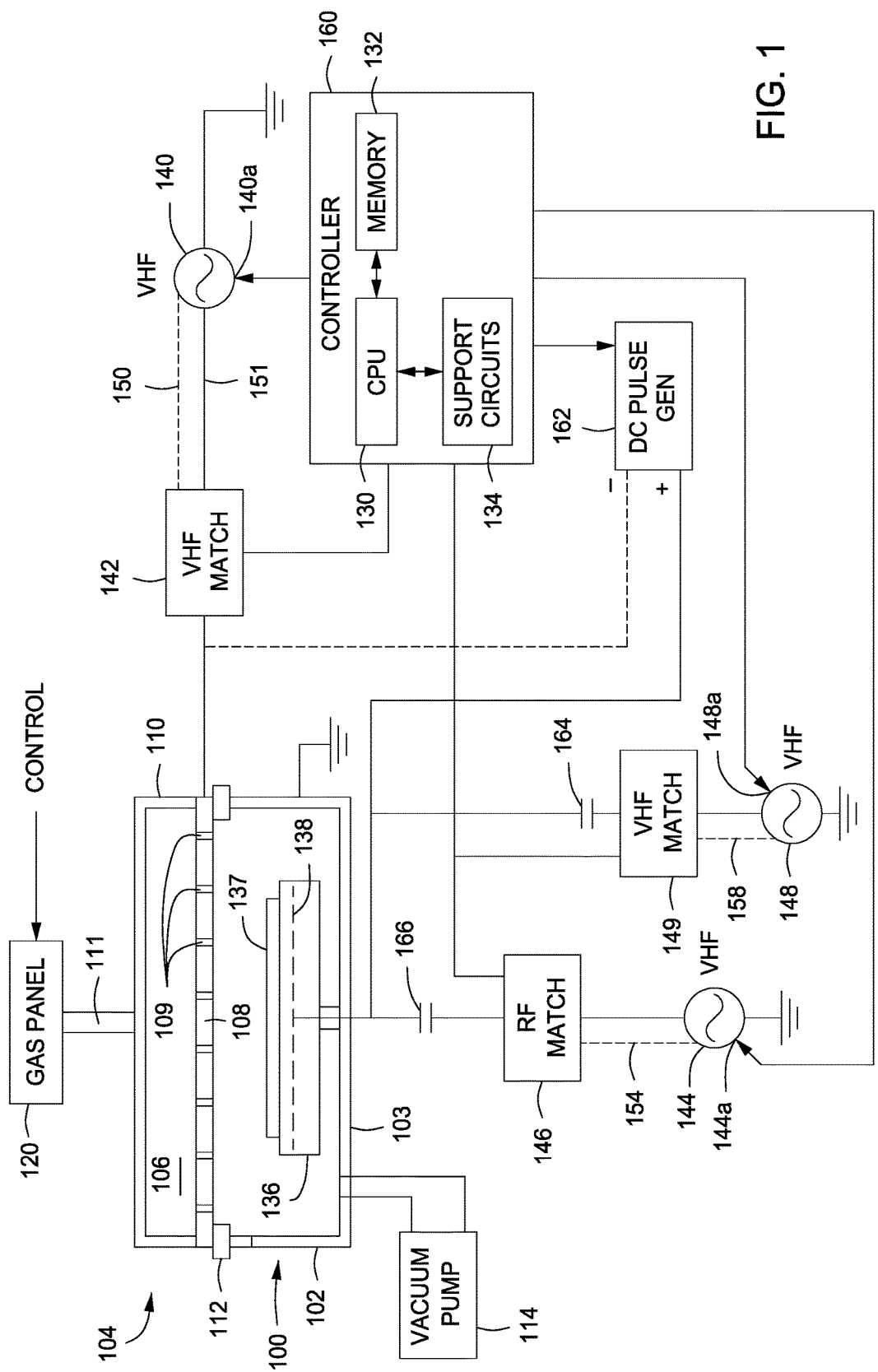
FIG. 1 depicts a plasma reactor in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure provide improved methods and apparatus for RF pulsing tuning using one or more variable frequency generators in addition to using a variable capacitor/inductor. Specifically, improved methods and apparatus use at least two degrees of tuning freedom to perform impedance matching by using at least one variable capacitor/inductor and one or more variable frequencies produced by one or more variable frequency generators. Since frequencies produced by one or more variable frequency generators can be quickly changed (i.e., at the microsecond level), they can quickly adjust and tune to new impendences produced by changes in total forward power within a single RF pulse cycle. In embodiments consistent with the present disclosure, an RF match network will send a frequency command set for all intervals within a single RF pulse cycle to a RF frequency generator. The RF generator will then create an RF pulse output with multiple frequencies for the single RF pulse cycle to minimize the reflected power for each interval within the single RF pulse cycle. The variable capacitor/inductor will be tuned to an average impedance value calculated. Embodiments consistent with the present disclosure advantageously minimizes RF pulse reflection in process chambers that use multiple separate RF power signals, pulsed at multiple power levels during a single duty cycle by using one or more variable frequency generators in addition to using one or more variable capacitors/inductors.

FIG. 1 depicts a plasma reactor which may be utilized to perform the inventive methods disclosed herein. The inventive methods may be performed in a capacitively coupled plasma reactor (e.g., as illustrated in FIG. 1) or any other suitable plasma reactor, such as an inductive coupled plasma reactor. However, the inventors have observed that the inventive methods can be particularly beneficial in capacitively coupled plasma reactors, such as where high bias power (e.g., about 2000 W or more) and low source power (e.g., about 500 W or less) is used, as undesired charging effects can be much more severe than, for example, in inductively coupled plasma processing chambers. In some embodiments, the inventors have discovered that the present inventive methods provide particular benefit in configurations where at least one of a DC bias ($V_{Dc}$), a $V_{RF}$, or a plasma sheath voltage are at or above about 1000V.

The reactor of FIG. 1 includes a reactor chamber 100 enclosed by a cylindrical side wall 102, a floor 103 and a ceiling 104. The ceiling 104 may be a gas distribution showerhead including a gas manifold 106 overlying a gas distribution plate 108 having orifices 109 formed through the gas distribution plate 108. The gas manifold 106 is enclosed by a manifold enclosure 110 having a gas supply inlet 111. The gas distribution showerhead (i.e., ceiling 104) is electrically insulated from the cylindrical side wall 102 by an insulating ring 112. A vacuum pump 114, such a turbomolecular pump, evacuates the chamber 100. A gas panel 120 controls the individual flow rates of different process gases to the gas supply inlet 111. A workpiece support pedestal 136 supported through the floor 103 of the chamber may have an insulating top surface and an internal electrode (wafer support electrode 138). The internal electrode may, for example, be used for chucking a substrate 137 on the top surface of the support pedestal 136. Plasma source power is applied to the ceiling 104 (also referred to herein as a gas distribution showerhead) from a generator 140 through an impedance matching network 142. The ceiling or gas distribution showerhead is formed of a conductive material, such as aluminum for example, and therefore serves as a ceiling electrode. The generator 140 may generate VHF power in the high portion of the VHF spectrum, such as in a range of 100 to 200 MHz. The generator 140 has the capability of pulsing the VHF power generated at a desired pulse rate and duty cycle. For this purpose, the VHF source generator 140 has a pulse control input 140a for receiving a control signal or signals defining the pulse rate and/or duty cycle as well as the phase of each pulse produced by the RF generator 140.

Plasma bias power is applied to the wafer support electrode 138 from an RF bias generator 144 through an RF impedance matching network 146, and RF bias generator 148 through an RF impedance matching network 149. The RF bias generators 144, 148 may generate HF or LF power in the low portion of the HF spectrum or in the MF or LF spectrum, such as in a range of 13.56 MHz or a on the order of 1-2 MHz. The RF bias generators 144, 148 have the capability of pulsing the RF bias power generated at a desired pulse rate and duty cycle. For this purpose, the RF bias generators 144, 148 have pulse control inputs 144a, 148a for receiving a control signal or signals defining the pulse rate and/or duty cycle as well as the phase of each pulse produced by the RF generators 144,148. The RF bias generators 144, 148 may be independently pulsed, phased, and/or duty cycle controlled. Further, the RF bias generators 144, 148 may be pulsed synchronously or asynchronously.

Optionally, plasma source power may be applied to the wafer support electrode 138 from a second VHF generator through a VHF impedance match (not shown). The second VHF generator may generate VHF power in the low portion of the VHF spectrum, such as in a range of 50 to 100 MHz. The second VHF generator has the capability of pulsing the VHF power generated at a desired pulse rate and duty cycle. For this purpose, the second VHF generator has a pulse control input for receiving a control signal or signals defining the pulse rate and/or duty cycle as well as the phase of each pulse produced by the second VHF generator. For example, in some embodiments, one of the RF bias generators 144, 148 and its components (e.g., match, pulse control inputs, etc.) can be replaced with the second VHF generator and its components. Alternatively, the second VHF generator and its components may be included in addition to the first RF generator 140, and the bias generators 144, 148 and their respective components.

In some embodiments, the matching networks 142, 146, and 149 may be formed by one or more capacitors and/or an inductor. The values of capacitor may be electronically or mechanically tuned to adjust the matching of each of the matching networks 142, 146, and 149. In lower power systems, the one or more capacitors may be electronically tuned rather than mechanically tuned. In some embodiments, the matching networks 142, 146, and 149 may have a tunable inductor. In some embodiments, one or more of the capacitors used in the matching networks 142, 146, and 149 may be one or more fixed capacitors or series capacitors. In other embodiments, one or more of the capacitors used in the matching networks 142, 146, and 149 may be a variable capacitor, which may be electronically or mechanically tuned to adjust the matching of the matching networks 142, 146, and 149. In some embodiments, one or more of the matching networks 142, 146, and 149 may have a capacitive shunt to ground.

Figure 6:
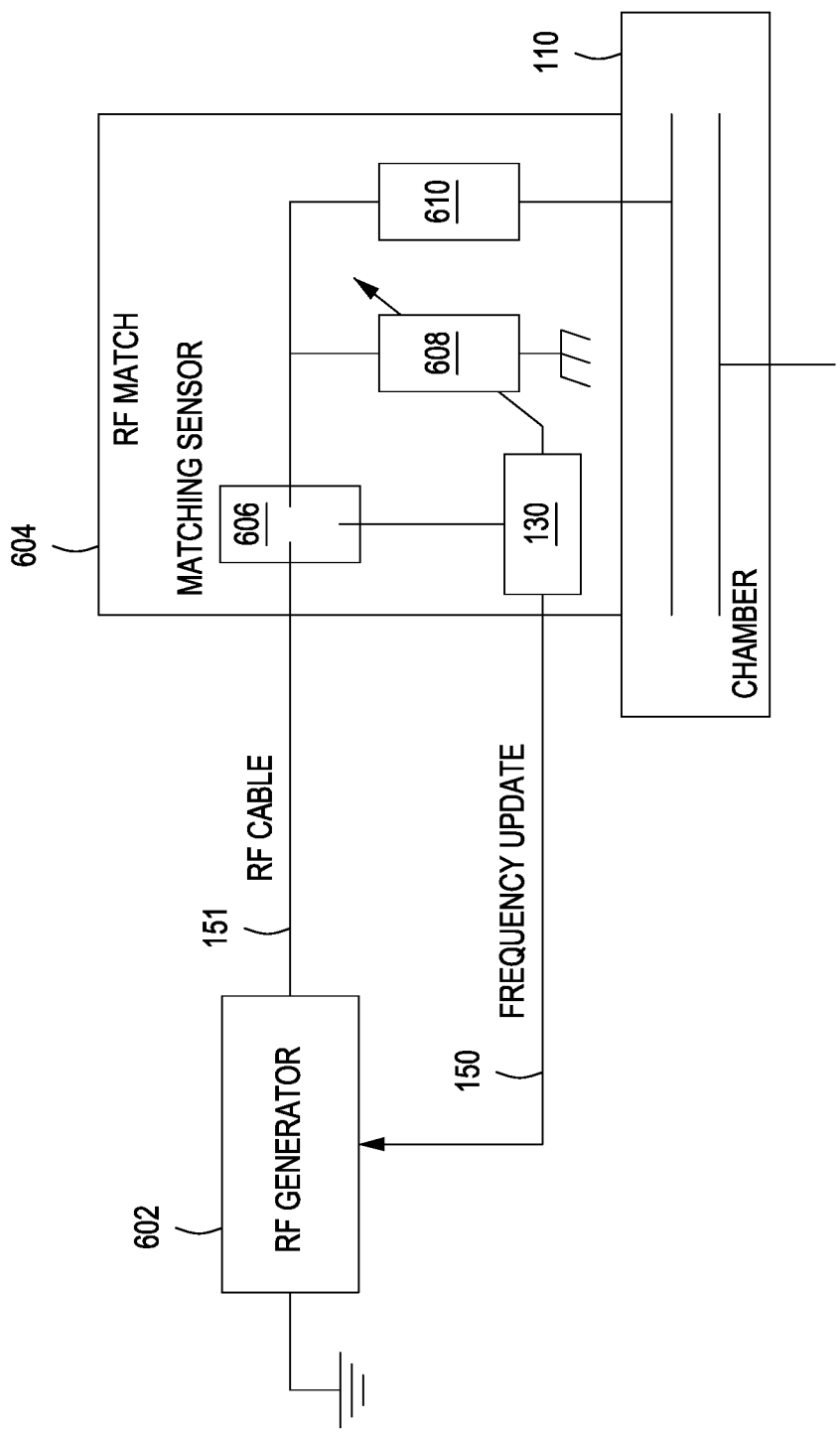
FIG. 6 depicts an exemplary apparatus for employing the smart tuning algorithm in accordance with some embodiments of the present disclosure.

The above described matching networks are illustrative only and other various configurations of matching networks having one or more adjustable elements for tuning the matching network may be utilized and tuned in accordance with the teachings provided herein. For example, FIG. 6 depicts an exemplary apparatus for employing the smart tuning algorithm in accordance with some embodiments of the present disclosure. RF generator 602 is a schematic representation of one or more of generators 140, 144 and 148 of FIG. 1. In FIG. 6, the RF generator 602 may be connected to the RF matching network 604 via RF cables 151 and one or more high speed link cables 150. RF match 604 is a schematic representation of one or more of RF/VHF matches 142, 146, 149. The RF matching network 604 may include one or more matching sensors or impedance measuring devices (e.g., VI probe/sensor 606), a CPU 130, a variable impedance matching component 608 (e.g., a variable capacitor/inductor), and a fixed component $Z_2$ 610 (e.g., a fixed capacitor/inductor. The variable impedance matching component 608 may include one or more variable capacitors and/or inductors to provide the desired impedance matching. A plurality of series cables may be used to supply the timing signals (e.g., a 13 MHz on/off timing signal) to the RF generator(s) 602 and the RF matching network 604. Thus, in this configuration, the reflected power can be reduced/minimized (i.e., the system can be tuned) by tuning the variable impedance matching component 608 to an average impedance calculated, as discussed below, and varying the frequency/power provided by the generators. This provides 2 degrees of tuning freedom (i.e., variable impedance matching component 608 and variable frequency)

A controller 160 is programmable to apply pulse control signals to each of the pulse control inputs 140*a*, 144*a*, 148*a* of the generators 140, 144, 148, to produce the desired phase lead or lag relationship and/or duty cycle relationship among the pulses of the generator 140 (e.g., VHF source power generator) and the RF bias power generators 144, 148. The controller 160 may also control other aspect of the tool/process chamber. Although shown as a separate component in FIG. 1, in some embodiments, the controller 160 can be disposed internally inside of each RF generator. Synchronization signals would be generated at a master generator (e.g., generator 140), and sent to other slave generators (e.g., generators 144 and/or 148).

In some embodiments, the RF generators 140, 144 and 148, the match networks 142, 146, and 149, and/or the controller 160 comprise a central processing unit (CPU) 130, a plurality of support circuits 134, and a memory 132. While the present exemplary embodiments of the RF generators 140, 144 and 148, the match networks 142, 146, and 149 and controller 160 are discussed with respect to a computer having a CPU, support circuits, and a memory, one of ordinary skill in the art would recognize that RF generators 140, 144 and 148, the match networks 142, 146, and 149, and controller 160 could be implemented in a variety of ways, including as an application specific interface circuit (ASIC), a field-programmable gate array (FPGA), a system-on-a-chip (SOC), and the like. Various embodiments of the controller 160 may also be integrated within other process tool controllers, with corresponding input/output interfaces as known in the art.

The support circuits 134 may include a display device as well as other circuits to support the functionality of the CPU 130. Such circuits may include clock circuits, cache, power supplies, network cards, video circuits and the like The memory 132 may comprise read only memory, random access memory, removable memory, disk drives, optical drives and/or other forms of digital storage. The memory 132 is configured to store an operating system, and a sub-fab control module. The operating system executes to control the general operation of the RF generators 140, 144 and 148, the match networks 142, 146, and 149, and controller 160, including facilitating the execution of various processes, applications, and modules to control the one or more generators 140, 144 and 148 or the match networks 142, 146, and 149 in order to perform the methods discussed here (e.g., method 900 discussed below).

Further, a DC generator 162 may be coupled to either (or both) the wafer support electrode 138 and the ceiling 104. In some embodiments, DC generator 162 may supply continuous and/or variable DC. In some embodiments, DC generator 162 may provide pulsed DC power. The pulse repetition rate, phase and duty cycle of the DC generator are controlled by the controller 160. A DC isolation capacitor 164, 166 may be provided to isolate each RF generator from the DC generator 162. A DC signal generated by the DC generator may be synchronized with the RF signals generated by the generators 140, 144, and 148 to provide benefits such as reduced charge-up on a substrate 137 or improved etch rate control of the substrate using a plasma formed in the plasma reactor.

FIG. 2A depicts a time domain waveform diagram that may reflect the pulsed RF output of each of the generators 140, 144, 148, showing the pulse envelope of the pulsed RF output, characterized by the following parameters controlled by the controller 160 individually for each generator 140,

144, 148: a pulse duration $t_P$, a pulse "on" time $t_{ON}$, a pulse "off" time $t_{OFF}$, a pulse frequency $1/t_P$, and a pulse duty cycle $(t_{ON}/t_P) \cdot 100$ percent. The pulse duration $t_P$ is the sum of $t_{ON}$ and $t_{OFF}$.

FIGS. 2B and 2C depict contemporaneous time domain waveforms of two RF pulsed signals synchronized together in such a manner that they have identical phase and duty cycle and therefore a phase difference of zero between them. The exemplary embodiment depicted in FIGS. 2B and 2C is one exemplary form of synchronization between a first pulsed RF signal (e.g., a pulsed source signal) and a second pulsed RF signal (e.g., a pulsed bias signal). In this exemplary embodiment, both the phase and duty cycle of each pulsed signal is the same.

Figure 3B:
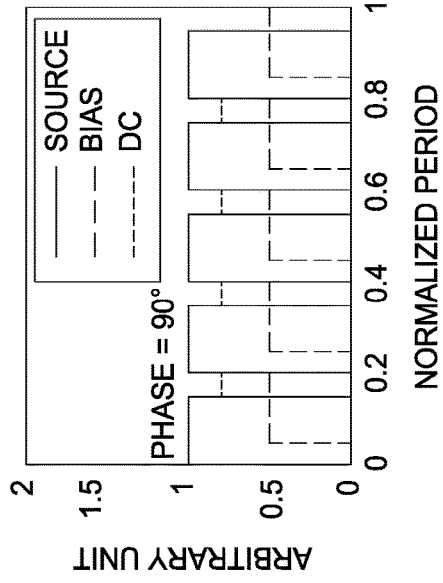
FIG. 3A-D depicts phase variance between pulsed waveforms in accordance with some embodiments of the present disclosure.
Figure 3D:
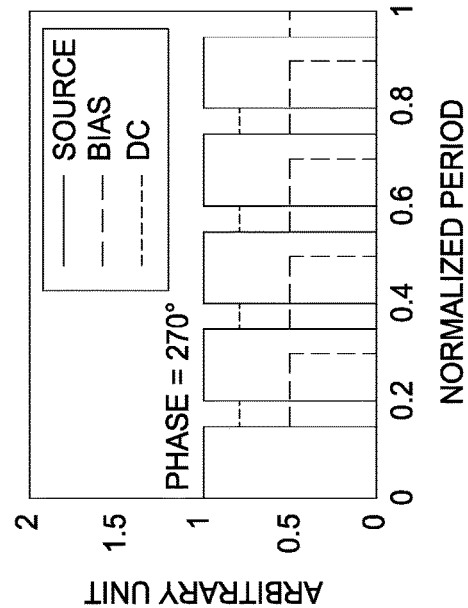
Figure 3A:
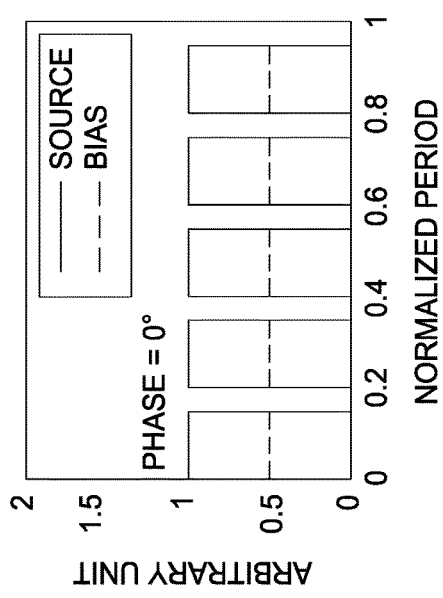
Figure 3C:
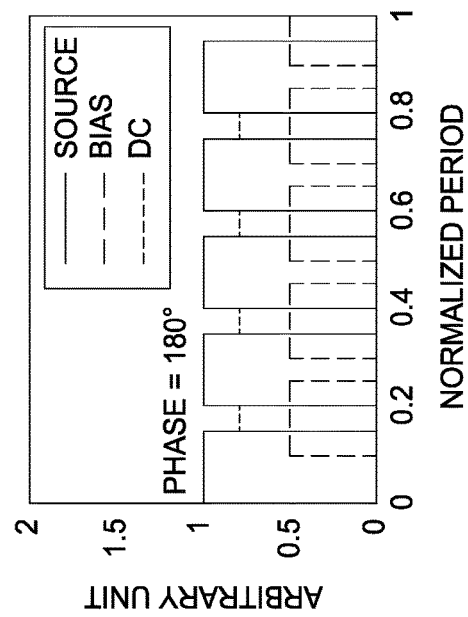

In some embodiments of the present disclosure, the pulsed signals provided by the generators 140, 144, and 148 are varied in phase. FIGS. 3A through 3D illustrate how the phase difference may be varied by the controller 160, and depict the superposition of the source and bias power waveforms at phase differences of 0°, 90°, 180° and 270°, respectively, where the phase difference is defined by how much the second pulse output lags the first pulse output. FIG. 3A corresponds to the example of zero phase difference of FIG. 2B. FIG. 3B depicts a case in which the bias power pulse output lags the source power pulse output by 90°. FIG. 3C depicts a case in which the bias power pulse output lags the source power pulse output by 180 degrees. FIG. 3D depicts a case in which the bias power pulse output lags the source power pulse output by 270°. Although FIGS. 3A-3B only depict two pulsed RF signals with varying phase, in embodiments consistent with the present disclosure can also include three or more pulsed RF signals with varying phases.

In some embodiments, etching rates may be enhanced while pulsing the plasma by controlling the phase lead or lag of the RF envelopes. When the source and bias are pulsed independently out-of-phase, or with varying duty cycle, the different plasma dynamics of the very high frequency (VHF) and low frequency (LF) allow for better plasma fill over the entire pulse. In some embodiments, a combination of VHF of about 162 MHz source frequency is used in conjunction with a bias frequency of about 13.56 MHz and another bias frequency of about 2 MHz. In some embodiments, a combination of VHF of about 162 MHz source frequency is used in conjunction with a bias frequency of about 60 MHz and another bias frequency of about 2 MHz. In some embodiments, a source frequency of about 60 MHz is used in combination with bias frequencies of about 2 MHz and/or about 13.56 MHz.

Figure 4:
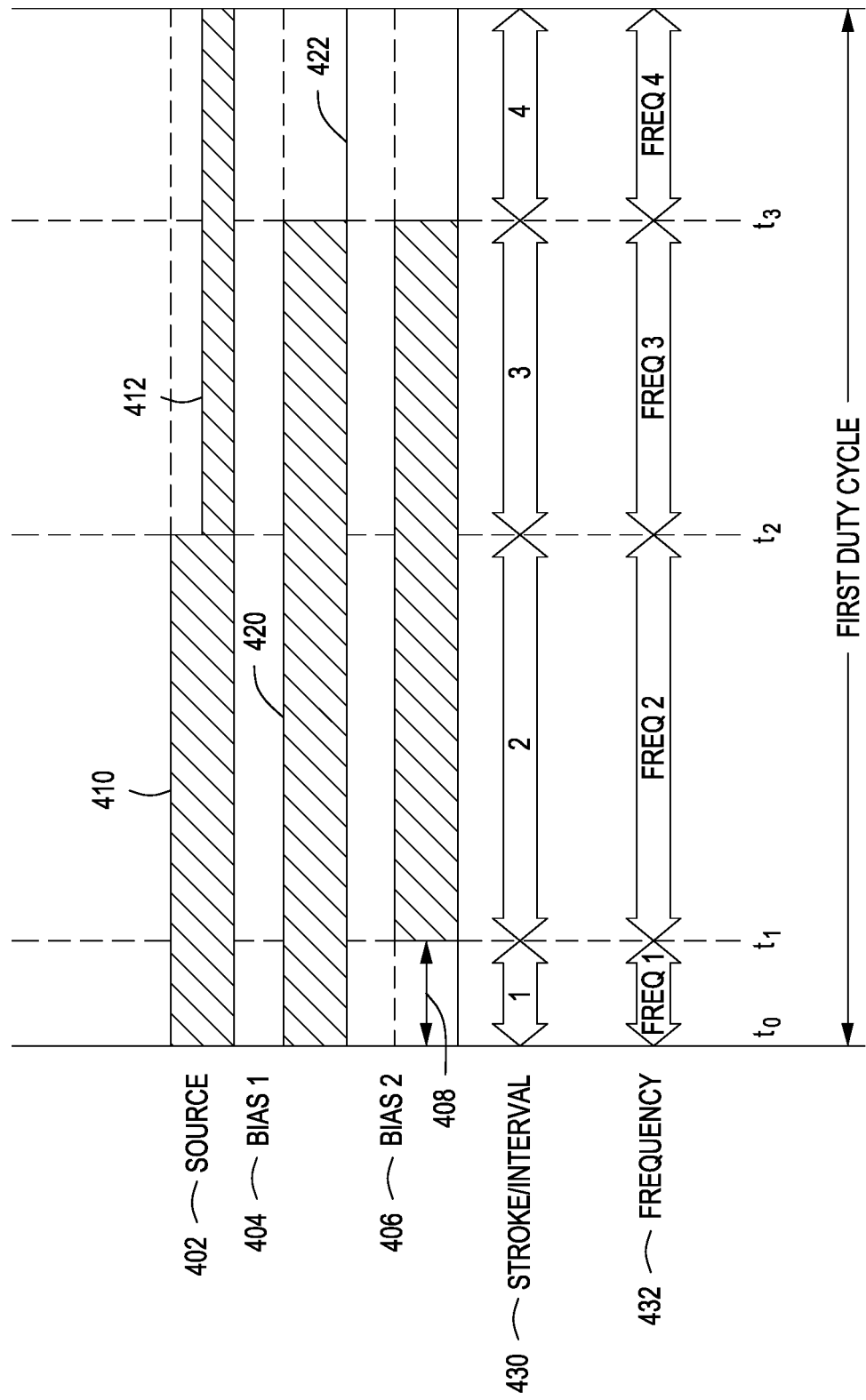
FIG. 4 depicts a Multi-Stroke Cycle Pulse (MSCP) with multiple pulsed power waveforms associated with a substrate processing recipe to process a substrate in accordance with some embodiments of the present disclosure.

FIG. 4 depicts the pulsed RF power associated with a substrate processing recipe to process a substrate. In the example shown in FIG. 4, the substrate processing recipe calls for three separate pulsed RF waveforms to be provided in order to process the substrate. FIG. 4 depicts multiple separate RF power signals that may be provided continuously or pulsed at multiple power levels in accordance with some embodiments of the present disclosure. FIG. 4 depicts a Multi-Stroke Cycle Pulse (MSCP) using multi-level pulsing (MLP) for multi-frequency RF mixing. Specifically, FIG. 4 depicts a four (4) stroke cycle pulse in which there are four different total frequencies provided by the separate RF power waveforms shown. In some embodiments, single level pulsing (SLP) (i.e., an on/off pulse wave form) and continuous waveforms (CW) may be used. In FIG. 4, three separate RF power waveforms are shown, a first RF power waveform 402, a second RF power waveform 404, and a third RF power waveform 406. Each of the three separate RF power waveforms 402, 404, and 406 may be provided at multiple power levels independently and out-of-phase with each other, or with varying duty cycle consistent with embodiments of the present disclosure. The RF power waveforms 402, 404, and 406 may be provided by one or more of source and bias RF generators 140, 144, and 148. In embodiments where there are two or more pulsed RF power waveforms, the separate pulsed RF power waveforms may be pulsed synchronously with each other. In some embodiments, the separate RF power waveforms may be pulsed asynchronously.

In some embodiments, the frequency of the first RF power waveform 402 may be about 2 Mhz to about 162 MHz. In some embodiments, the power level of the first DLP RF power waveform may be about 200 watts to about 5.0 KW (e.g., 3.6 KW). If the first RF power waveform is pulsed, the value of the second power level may be about 0-100% of the first power level. In other embodiments, the second power level may be greater than the first power level.

In FIG. 4, the first RF power waveform 402 may be introduced at time $t_0$ and may comprise a first power pulse 410 at a first power level and a second power pulse 412 at a second power level. In some embodiments, the first RF waveform 402 may be provided at a frequency of about 2 MHz to about 162 MHz. In other embodiments, other frequencies as described above may be used.

The second RF power waveform 404 may also be introduced at time $t_0$ or after a delay period 408. The second RF power waveform 404 may comprise a first power pulse 420 at a first power level and a second power pulse 422 at a second power level. As illustrated in FIG. 4, the first RF power pulse 420 may precede the second RF power pulse 422. If desired, additional RF power pulses may be provided in that order, or in a different order. As shown in FIG. 4, the first RF power pulse 420 may be provided at a high power level, the second RF power pulse 422 may be provided at a zero power level, or a low power level that is lower than the first power level of the first RF power pulse 420. Additional steps (i.e., additional RF power pulses) and power levels may be used as appropriate. In some embodiments, the length of each of the time periods that each RF power pulse 420 and 422 is applied may be different from each other. In other embodiments, the length of each of the time periods that each RF power pulse 420 and 422 is applied may be equivalent to each other. In some embodiments, the second RF waveform 404 may be provided at a frequency of about 2 MHz to about 162 MHz. In other embodiments, other frequencies as described above may be used.

The third RF power waveform 406 may also be introduced at time $t_0$ (as shown) or after a delay period 408. The third RF power waveform 406 may comprise similar features as described above with respect to the first RF power waveform 402 and/or the second RF power waveform 404.

In some embodiments, the duty cycles of the separate RF power waveforms, are synchronized. In some embodiments, a separate synchronized TTL timing signal may also be applied which also affects the impendences. In some embodiments, the synchronized timing signal may be a 13 MHz on/off timing signal. In some embodiments the synchronized timing signal may be a DC signal.

In FIG. 4, four separate intervals/strokes 430, one for each different frequency 432 and forward power provided, with varying impendences and reflected power levels. In the example shown in FIG. 4, none of the intervals/periods have similar frequencies. However, in FIG. 4, at each new interval where the total forward power provided changes, the system tunes to compensate for the new reflected power based on the total forward power provided. In some instances, the adjustment may be large if the change in total forward power provided is also large. In order to minimize the reflected power further, the inventors have developed a method and apparatus which tunes the multiple impedance levels faster to minimize the average reflected power using the method shown in FIGS. 5A and 5B and described below.

Figure 5A:
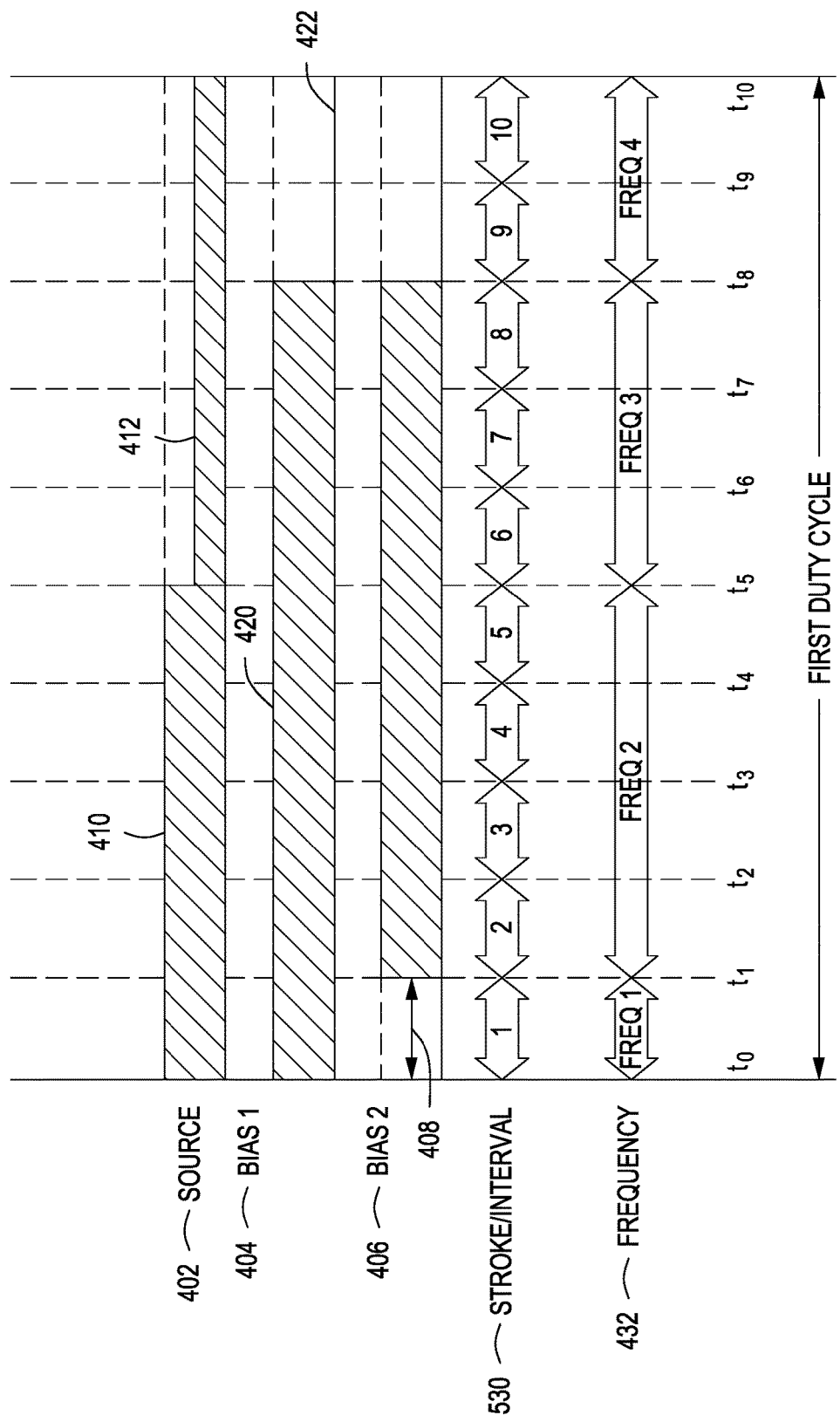
FIG. 5A depicts the same MSCP with multiple pulsed power waveforms depicted in FIG. 4 for a single duty cycle that has been divided into a plurality of equal time intervals in accordance with some embodiments of the present disclosure.
Figure 5B:
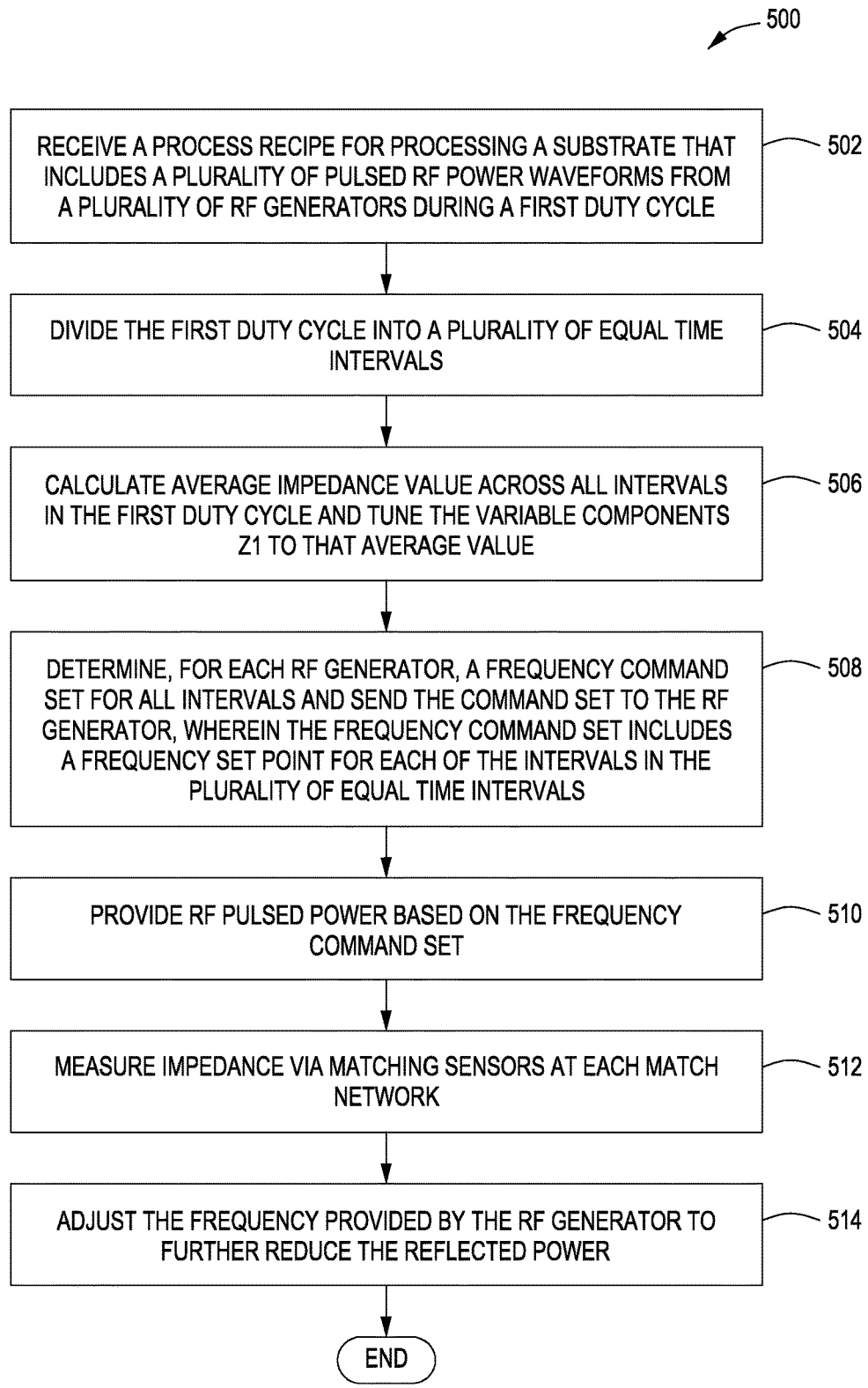
FIG. 5B depicts a flow chart of a method for RF pulse reflection reduction in process chambers that use multiple separate RF power signals pulsed at multiple power levels for a single duty cycle that has been divided into a plurality of equal time intervals in accordance with some embodiments of the present disclosure.

FIG. 5A depicts the pulsed RF power associated with a substrate processing recipe to process a substrate shown in FIG. 4. However, in FIG. 5A, the duty cycle is divided into equal time intervals 530. In the example shown in FIG. 5A, the duty cycle is divided into 10 equal time periods. FIG. 5B depicts a flow chart of a method 500 which tunes the multiple impedance levels faster to minimize the average reflected power by dividing the duty cycle into equal time intervals as shown in FIG. 5A. The flow chart in FIG. 5B is described below in conjunction with FIGS. 1, 5A and 6. In embodiments consistent with the present disclosure, method may be performed by one or more RF match 604, one or more RF generator 602, or controller 160.

The method 500 begins at 502, where a process recipe for processing a substrate is received. The process recipe includes a plurality of pulsed RF power waveforms (i.e., 402, 404, and 406) from a plurality of RF generators 602 for a first duty cycle. At 504, the process recipe is analyzed in the first duty cycle is divided into about a plurality of equal time intervals. For example, as shown in FIG. 5A, the first duty cycle may be divided into 10 equal strokes or time intervals. At 506, an average impedance value across all time intervals in the first duty cycle is calculated, and the variable components 608 (e.g., a variable capacitor/inductor) of RF match 604 may be tuned to that average value. In some embodiments, each of the variable components 608 in RF/VHF matches 142, 146 and 149 are tuned to the same average impedance value calculated. FIGS. 5A and 5B describe the processing that occurs during a single duty cycle, which may be repeated as necessary to process the substrate. In some embodiments consistent with the present disclosure, the process recipe may include the RF pulse power waveforms for all duty cycles, which may not always be identical to each other in terms of frequency and power at each interval. Thus, each individual duty cycle may be separately analyzed and divided into a plurality of equal time intervals.

At 508, a frequency command set for one or more of generators 602 (e.g., generators 140, 144 or 148) is determined. The frequency command set includes the frequency and/or power set points for each of the equally divided time intervals (i.e., strokes) in the first duty cycle. The determined frequency command set for each of generators 140, 144 or 148 is sent to the corresponding generators 140, 144 or 148 associated with the frequency command set. In some embodiments, the frequency command set may be sent to the respective generators via high-speed secondary communication cables 150, 154, 158. In other embodiments, the frequency command set may be sent to the respective generators via the controller 160.

At 510 a plurality of pulsed RF power waveforms (e.g., 402, 404, and 406) from the plurality of RF generators is provided to the process chamber according to/based on the frequency command set sent to each generator during the first duty cycle. That is, at the beginning of each of the plurality of equally divided time intervals/strokes, the RF pulse power will be provided at the frequency set point determined at 508. In some instances, no adjustment will be necessary if the previous set point for a previous time interval is equal to that of the set point in the subsequent time interval, unless there was an adjustment to the frequency to reduce the reflected power based on the measured values as will be described below. In some embodiments, a first pulsed RF power waveform 402 of the plurality of waveforms is an RF source signal provided by the generator 140, a second pulsed RF power waveform 404 of the plurality of waveforms is an RF bias signal provided by the generator 144, and a third pulsed RF power waveform 406 of the plurality of waveforms is a second RF bias signal provided by the generator 148.

At 512, the impedance/reflected power is measured at each match network 604 by matching sensor 606. At 514 the frequency and/or power provided by one of more of the RF generators may be adjusted to further reduce the reflected power based on the impedance measured at 512. These micro frequency adjustments can be sent via high-speed secondary communications cables 150, 154, 158. The method repeats and returns to 510 to provide the RF pulse power at the beginning of each new interval, measure the reflected/power impedance at 512, and adjust the frequency/power provided at 514 until processing of the substrate is complete, at which point the method ends at 516.

The method 500 is executed by one or more processors of a plasma reactor, e.g., processors of one or more of the RF/VHF Matches, processors of one or more of RF generators, a processor of pulse controller, etc. Examples of a processor include an application specific integrated circuit (ASIC), a programmable logic device (PLD), a microprocessor, a microcontroller, a central processing unit (CPU), etc.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network, the data may be processed by other computers on the network, e.g., a cloud of computing resources.

One or more embodiments can also be fabricated as computer-readable code on non-transitory computer-readable medium. The computer-readable medium is any data storage that can store data, which can be thereafter be read by a computer system. Examples of the computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage devices. The computer-readable medium can include computer-readable tangible medium distributed over a network-coupled computer system so that the computer-readable code is stored and executed in a distributed fashion.

While the foregoing is directed to embodiments of the present disclosure, other and further embodiments of the disclosure may be devised without departing from the basic scope thereof.

The invention claimed is:

1. A method for processing a substrate in a plasma enhanced substrate processing system, comprising:
   (a) receiving a process recipe for processing the substrate that includes a plurality of pulsed RF power waveforms from a plurality of RF generators during a first duty cycle;
   (b) dividing the first duty cycle into a plurality of time intervals;
   (c) for each RF generator, determining a frequency command set for all intervals, wherein the frequency command set includes a frequency set point for each of the intervals in the plurality of equal time intervals; and
   (d) providing a plurality of RF power waveforms from the plurality of RF generators to a process chamber during the first duty cycle according to the frequency command set determined for each RF generator.

2. The method of claim 1, further comprising:
   measuring a first reflected power or impedance during a first one of the plurality of time intervals; and
   adjusting a frequency or power provided by at least one of the plurality of RF generators to reduce the reflected power or impedance.

3. The method of claim 2, wherein providing a plurality of RF power waveforms from a plurality of RF generators to a process chamber during a first duty cycle according to the frequency command set determined for RF generator includes providing power at a frequency set point for a second one of the plurality of time intervals, the method further comprising:
   measuring a second reflected power or impedance during a second one of the plurality of time intervals; and
   adjusting a frequency or power provided by at least one of the plurality of RF generators to reduce the reflected power or impedance.

4. The method of claim 1, further comprising:
   calculating an average impedance value across all intervals in the first duty cycle; and
   tuning variable match components in one or more RF match networks to the calculated average value.

5. The method of claim 4, wherein the variable match components that are tuned to the calculated average value includes at least one of a variable capacitor or inductor.

6. The method of claim 4, wherein the variable match components that are tuned to the calculated average value are one of electronically tuned or mechanically tuned.

7. The method of claim 1, wherein the plurality of time intervals are equally divided time intervals.

8. The method of claim 1, wherein the frequency command set is determined by and RF match network.

9. The method of claim 8, wherein the frequency command set is sent to the RF generator via a high speed communication cable that directly and communicatively couples the RF match network and the RF generator.

10. The method of claim 8, wherein the frequency command set is sent to the RF generator by the RF match network indirectly via a pulse controller communicatively coupled to the RF network and the RF match.

11. The method of claim 1, further comprising:
    receiving a timing signal from one of the plurality of RF generators to synchronize the plurality of RF power waveforms from the plurality of RF generators.

12. The method of claim 11, wherein the timing signal is a 13 MHz on/off timing signal.

13. The method of claim 1, wherein at least one of the plurality of RF power waveforms is a dual level pulsing (DLP) waveform pulsed at multiple power levels.

14. The method of claim 1, further comprising:
    for each RF generator, sending the determined frequency command set to the RF generator.

* * * * *